(12) United States Patent
Gris

(10) Patent No.: US 6,258,720 B1
(45) Date of Patent: Jul. 10, 2001

(54) METHOD OF FORMATION OF CONDUCTIVE LINES ON INTEGRATED CIRCUITS

(75) Inventor: Yvon Gris, Tullins (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/245,003

(22) Filed: Feb. 4, 1999

(30) Foreign Application Priority Data

Feb. 10, 1998 (FR) .................................................. 98 01792

(51) Int. Cl.$^7$ .......................... H01L 21/20; H01L 21/40; H01L 21/4763; H01L 21/44; H01L 21/302

(52) U.S. Cl. .................. 438/689; 438/597; 438/397; 438/629; 438/639; 438/688; 438/622; 438/625; 438/637

(58) Field of Search .................... 438/597, 397, 438/689, 629, 639, 688, 622, 625, 637

(56) References Cited

U.S. PATENT DOCUMENTS

| | | | |
|---|---|---|---|
| 4,544,445 | 10/1985 | Jeuch et al. ........................ | 156/643 |
| 5,063,175 | * 11/1991 | Broadbent ........................ | 437/192 |
| 5,268,329 | * 12/1993 | Chittipeddi ........................ | 437/195 |
| 5,270,254 | * 12/1993 | Chen ........................ | 437/190 |

OTHER PUBLICATIONS

French Search Report from French Patent Application 98 01792, filed Feb. 10, 1998.
Patent Abstracts of Japan, vol. 013, No. 338 (E–795), Jul. 28, 1989 & JP-A-01 099239 (Hitachi Ltd.).
Patent Abstracts of Japan, vol. 097, No. 003, Mar. 13, 1997 & JP-A-08 298 285 (Oki Electric Ind. Co. Ltd.).

* cited by examiner

*Primary Examiner*—Matthew Smith
*Assistant Examiner*—Chuong Lee
(74) *Attorney, Agent, or Firm*—Wolf, Greenfield & Sacks, P.C.; James H. Morris; Theodore E. Galanthay

(57) ABSTRACT

The present invention relates to a method of formation of a conductive line on integrated circuits including the steps of etching a first insulator layer to create therein openings of predetermined width at the locations where the conductive line is to be formed; depositing and etching a first interconnection layer of a first thickness; and depositing and etching a second interconnection layer of a second thickness; the predetermined width being higher than twice the greatest of the two thicknesses, and lower than twice the sum of the thicknesses.

25 Claims, 3 Drawing Sheets

METHOD OF FORMATION OF CONDUCTIVE LINES ON INTEGRATED CIRCUITS

BACKGROUND OF HTE INVENTION

1. Field of the Invention

The present invention relates to the formation of conductive lines on integrated circuits. It more specifically aims at forming low resistance conductive lines adapted, in particular, to forming inductance conductors for radiofrequency applications or lines for carrying a high current, for example, for microprocessor clock supply lines.

2. Discussion of the Related Art

Generally in the field of integrated circuit manufacturing, a succession of steps of metallization deposition meant to ensure the circuit interconnections is provided.

When a conductive line with a particularly low resistance is desired to be obtained, it can of course be provided to deposit a thicker metallization. However, this requires a specific manufacturing step and raises etching problems.

Another idea is to superpose two metallization layers to obtain a resulting metallization of double thickness.

SUMMARY OF THE INVENTION

An object of the present invention is to provide a novel method of manufacturing of conductive lines with a particularly low resistance which is compatible with conventional methods of formation of metallization levels on integrated circuits.

Generally, to achieve this and other objects, the present invention uses a conventional mode of deposition of two successive interconnection layers by previously etching a substrate so that the total metallization thickness is higher than the sum of the individual thicknesses of the two deposited layers.

More specifically, the present invention provides a method of formation of a conductive line on integrated circuits including the steps of etching a first insulator layer to create therein openings of predetermined width at the locations where the conductive line is to be formed; depositing and etching a first interconnection layer of a first thickness; and depositing and etching a second interconnection layer of a second thickness; the predetermined width being higher than twice the greatest of the two thicknesses, and lower than twice the sum of the thicknesses.

According to an embodiment of the present invention, the step of deposition and etching of the first interconnection layer is preceded by a step of formation of conductive spacers of a third thickness on the lateral walls of the openings, the predetermined width then being increased by twice the thickness of the spacers.

According to an embodiment of the present invention, the step of deposition and etching of the second interconnection layer is immediately preceded by the steps of depositing a second insulator layer; etching the second insulator layer to expose the first interconnection layer above the openings; and depositing a second etch stop layer.

According to an embodiment of the present invention, the first and second interconnection layers are layers of a conductor chosen from the group comprising aluminum, copper, and their alloys, possibly with silicon.

According to an embodiment of the present invention, the spacers are made of tungsten.

The present invention also provides a conductive line formed on a surface of a substrate, the upper surface of the substrate comprising an insulating layer in which is formed an opening of predetermined width at the location where the conductive line is to be formed, including a first interconnection layer of a first thickness and a second interconnection layer of a second thickness, the predetermined width being higher than twice the greatest of the two thicknesses, and lower than twice the sum of the thicknesses.

According to an embodiment of the present invention, several parallel openings are formed at a low distance from one another.

The foregoing objects, features and advantages of the present invention, will be discussed in detail in the following non-limiting description of specific embodiments in connection with the accompanying drawings.

DETAILED DESCRIPTION

For clarity, and as usual in the representation of integrated circuits, the different drawings are not to scale. Further, same elements are designated by same references.

FIGS. 1 to 4 are simplified cross-sectional views illustrating steps of a conventional method of formation of vias and interconnections above the semiconductive structure of an integrated circuit.

Figure 1:
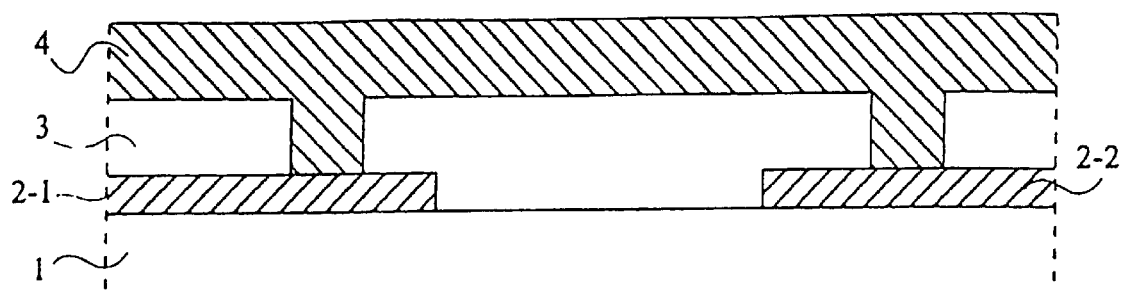
FIGS. 1 to 4 illustrate successive steps of a conventional method of formation of interconnections on an integrated circuit.

FIG. 1 shows the result of initial steps of a conventional method. An insulating layer 1 (an upper layer of an integrated circuit) on which metallization areas 2-1, 2-2 have been formed is considered. On top of this structure, a layer of an insulating material 3, typically silicon oxide, is formed. Layer 3 is planarized and provided, by known methods, with openings adapted to subsequently enable establishment of electric contacts or vias between areas 2-1, 2-2 and interconnection layers subsequently deposited. On top of this structure, a first etch stop and/or bonding layer (not shown), followed by a first filling layer 4, are conventionally deposited. The etch stop layer, which is very thin, is typically formed of successive Ti and TiN layers. Filling layer 4 is, for example, made of tungsten. The openings formed in insulating layer 3 are narrow enough, as compared to the thickness of layer 4, to be filled by the material forming layer 4.

Figure 2:
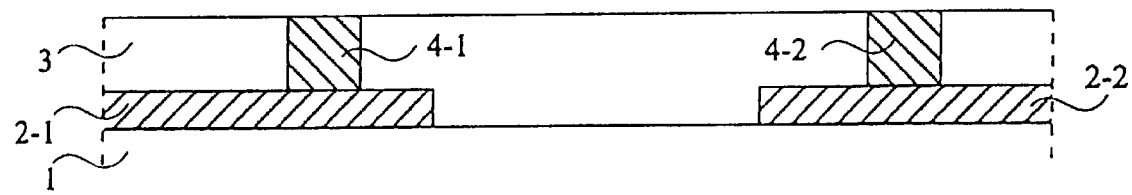

At the next step, shown in FIG. 2, the first filling layer 4 is etched to obtain a substantially flat structure provided with vias 4-1 and 4-2 respectively in contact with areas 2-1 and 2-2.

Figure 3:
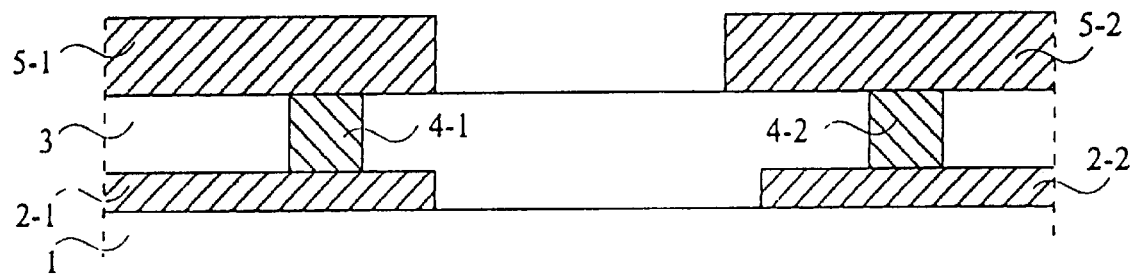

At the next step, shown in FIG. 3, a first interconnection layer 5 is deposited and etched. In the example of FIG. 3, portions 5-1 and 5-2 of layer 5 are respectively put in contact with metallization areas 2-1 and 2-2 by vias 4-1 and 4-2. Layer 5 is, for example, made of aluminum, copper, or an alloy of these elements, together and/or with silicon.

As previously, the deposition of layer 5 is preferably preceded by the deposition of a second very thin etch stop layer, typically Ti/TiN (not shown).

Figure 4:
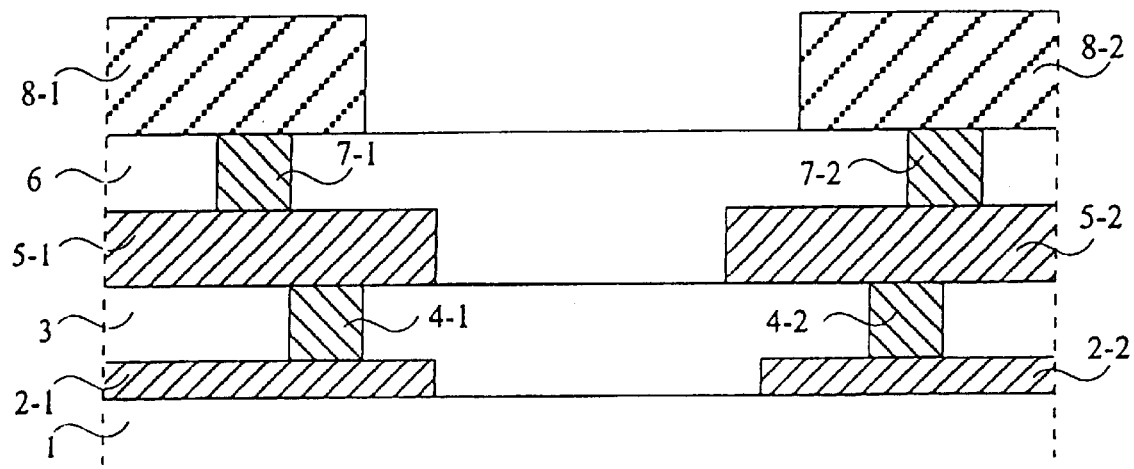

As illustrated in FIG. 4, the steps illustrated in FIGS. 1 and 2 are then repeated to form vias 7-1, 7-2 in an insulating layer 6. After this, metallization elements 8-1, 8-2 are formed in a second interconnection layer 8.

The preceding description, in conjunction with FIGS. 1 to 4, is only one example of the method of fabrication of vias and interconnections.

The connections obtained by a method such as that previously described are perfectly satisfactory for the formation of conventional interconnections. However, the metallizations so obtained can have too high a resistance to be useful for the formation of specific conductive lines such as lines forming inductance conductors or power lines.

A method of formation of very conductive lines (lines having a low enough resistance) according to the present invention will be described hereafter in relation with FIGS. 5 to 7. Then, this method will be shown, in relation with FIGS. 8 to 11, to be compatible with a conventional method such as that described in relation with FIGS. 1 to 4.

Figure 5:
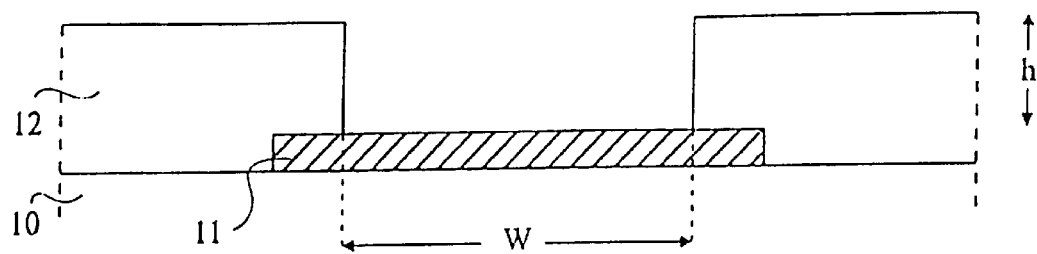
FIGS. 5 to 7 illustrate successive steps of a general method according to the present invention.

FIG. 5 shows, in cross-sectional view, the result of initial steps of the method according to the present invention. An insulating layer 10 formed above a substrate is considered. Generally, metallization areas 11 are provided on insulating layers 10. Above this structure, a layer of an insulating material 12 is formed. Layer 12 is planarized and provided with a window of width W and of height h, the height being lower than the width. The window is preferably formed above a metallization area 11 to be put in contact with interconnection layers subsequently deposited (this metallization 11 is not shown in FIGS. 6 and 7).

Figure 6:
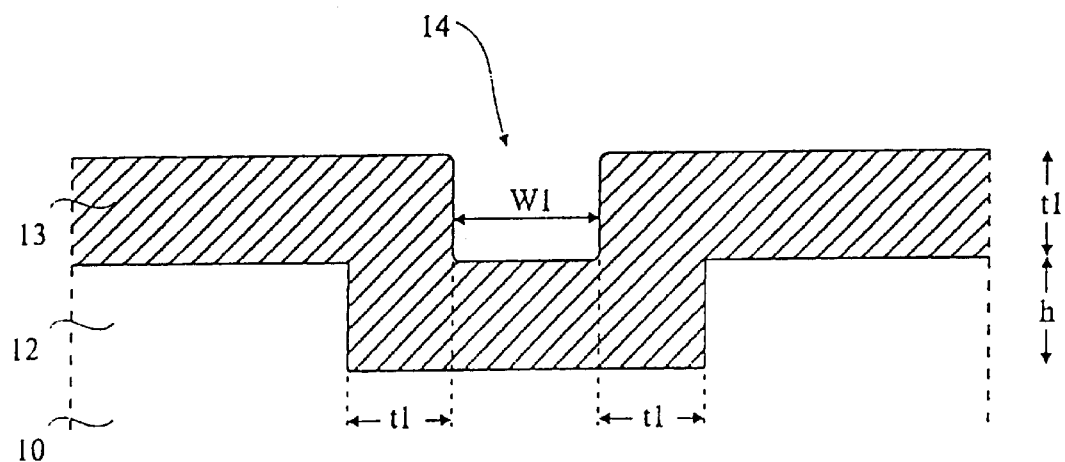

At the next step, shown in FIG. 6, a first interconnection layer 13 of thickness t1 is deposited.

Figure 7:
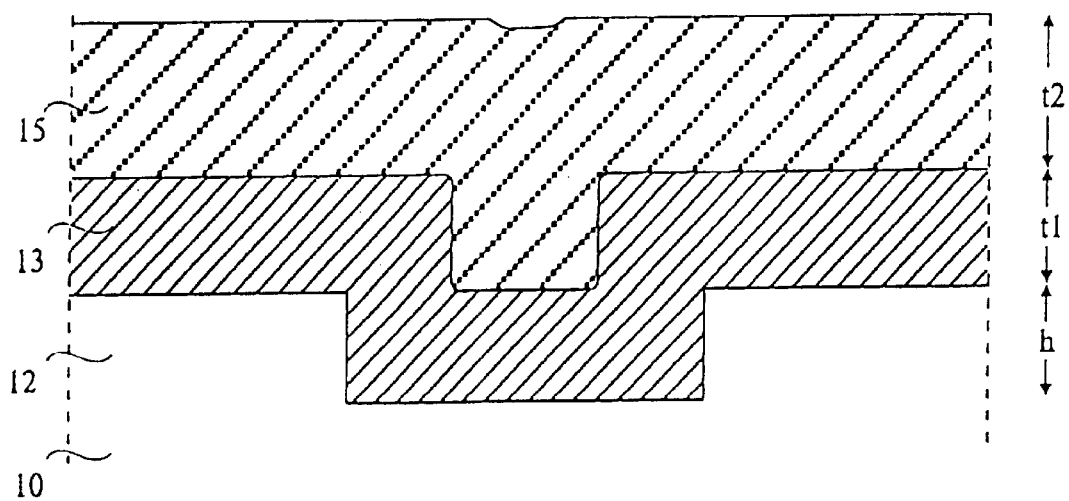

At the next step, shown in FIG. 7, a second interconnection layer 15 of thickness t2 is deposited.

It should be noted that layers 13 and 15 are layers conventionally formed in a method of formation of metallizations and vias above a semiconductive structure, and correspond, for example, to previously-described layers 5 and 8.

The thickness t1 of layer 13 is lower than half the width W of the window. For this reason, the upper surface of layer 13 exhibits a hollowing 14 having a width W1. Width W1 is lower by substantially twice thickness t1 of interconnection layer 13 than the width W of the initial window, that is, W1≈W2t1. The height of this hollowing 14 is substantially height h of insulating layer 12.

The thickness t2 of interconnection layer 15 subsequently deposited is higher than half the width W1 of hollowing 14 formed in layer 13. Thereby, given the growth properties of metal layers in conformal depositions, hollowing 14 is completely filled, and the upper surface of layer 15 is substantially planar. Types of conformal depositions likely to be used are, for example, chemical vapor deposition (CVD) or hot metal sputtering techniques, the metal typically comprising aluminum and copper.

Across the entire initial window, the height of deposited metal is equal to the sum of the thicknesses of interconnection layers 13 and 15, respectively, t1 and t2, and of the height h of insulating layer 12, in the case considered hereabove where W<2(t1+t2).

FIGS. 8 to 11 illustrate a specific mode of implementation of the method according to the present invention compatible with the specific method of implementation described with respect to FIGS. 1 to 4.

Figure 8:
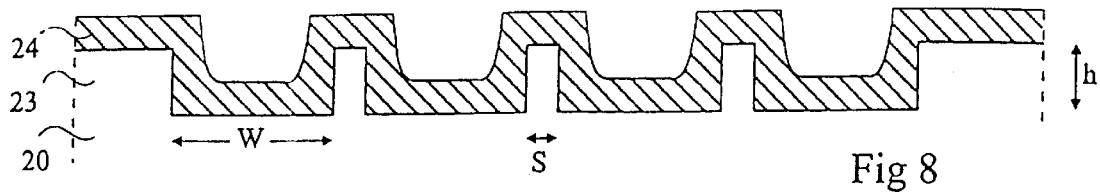
FIGS. 8 to 11 show successive steps of an example of embodiment of the method according to the present invention.

FIG. 8 shows the result of initial steps and corresponds to the step illustrated in FIG. 1. An insulating layer 20 formed above a substrate is considered. As in the case of FIG. 1, metallization areas, not shown, may be provided on insulating layer 20. A layer of an insulating material 23, of a height h, is formed. Layer 23 is provided with windows of a predetermined width W, distant by an interval S as small as possible. A first etch stop layer of negligible thickness (not shown) is then deposited on this structure, after which a filling layer 24, for example, identical to layer 4 of FIG. 1, is deposited.

Figure 9:
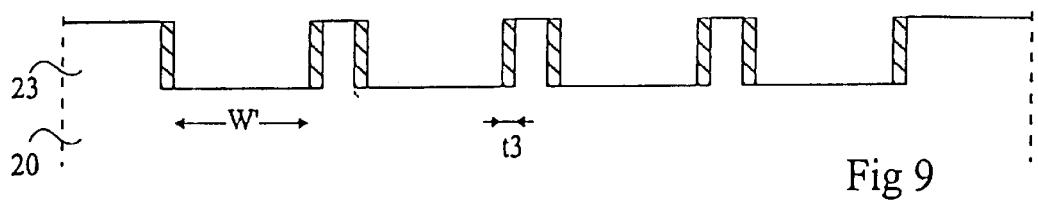

At the next step, shown in FIG. 9, filling layer 23 is etched, for example by plasma etching, which corresponds to the step shown in FIG. 2. However, since the windows are much larger than vias 4-1 and 4-2, spacers of thickness t3 are formed on the lateral walls of the windows. Thickness t3 is thus substantially equal to half the width of vias 4-1, 4-2. Thereby, the window width is reduced to a width W' substantially equal to W−2t3.

Figure 10:
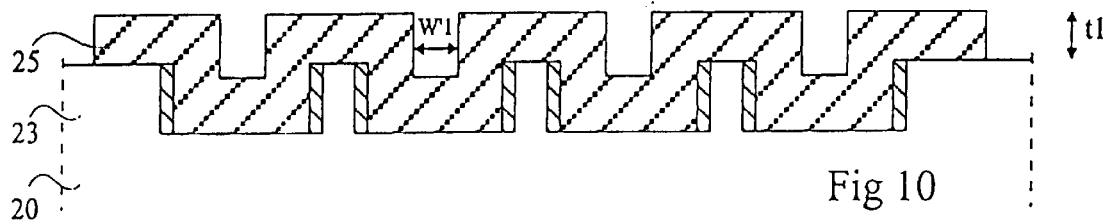

At the next step, shown in FIG. 10, and corresponding to the conventional step shown in FIG. 3, a first interconnection layer 25, for example, equal to layer 5, is deposited and etched. The thickness t1 of this layer being lower than half the width W' of the windows, the upper surface of layer 25 exhibits hollowings of width W'1 substantially equal to W'-2t1.

Figure 11:
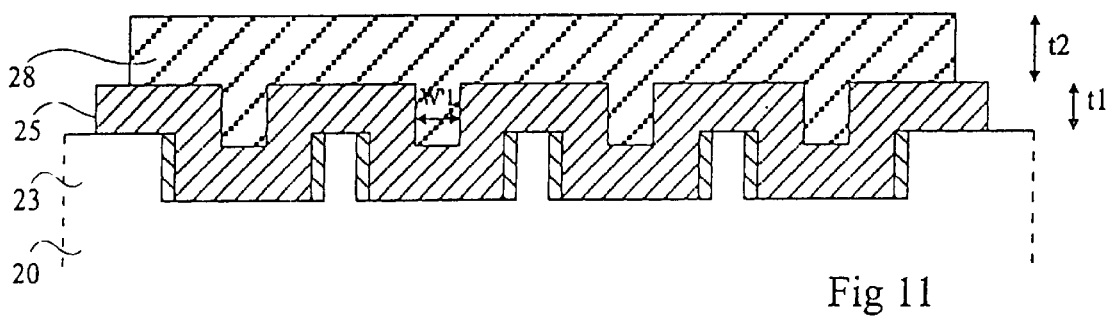

At the next step, shown in FIG. 11, a second etch stop layer, of negligible thickness (not shown), is deposited, followed by a second interconnection layer 28, of thickness t2. According to the present invention, thickness t2 is such that the hollowings of layer 25 are completely filled. In practice, thickness t2 is chosen to be the greatest that can be obtained by standard methods.

As can be seen in FIG. 11, the conductive line has, above the windows, a thickness greater than the sum of individual thicknesses t1 and t2 of first and second interconnection layers 25 and 28. Only above insulator portions 23 does it have thickness t1+t2 but, as seen previously, these portions have a width S low as compared to the width W of the windows.

In a specific embodiment of the present invention, height h of insulating layer 23 is on the order of 0.6 to 0.8 μm, width W is on the order of 2 to 4 μm, the interval between the windows is on the order of 0.4 μm. First interconnection layer 25 is made of aluminum, or aluminum-copper, of a thickness t1 between 0.6 and 1 μm. Second interconnection layer 28 is aluminum, or aluminum-copper, sputtered at high temperature, over a thickness on the order of 0.8 to 1.2 μm.

Figure 12:
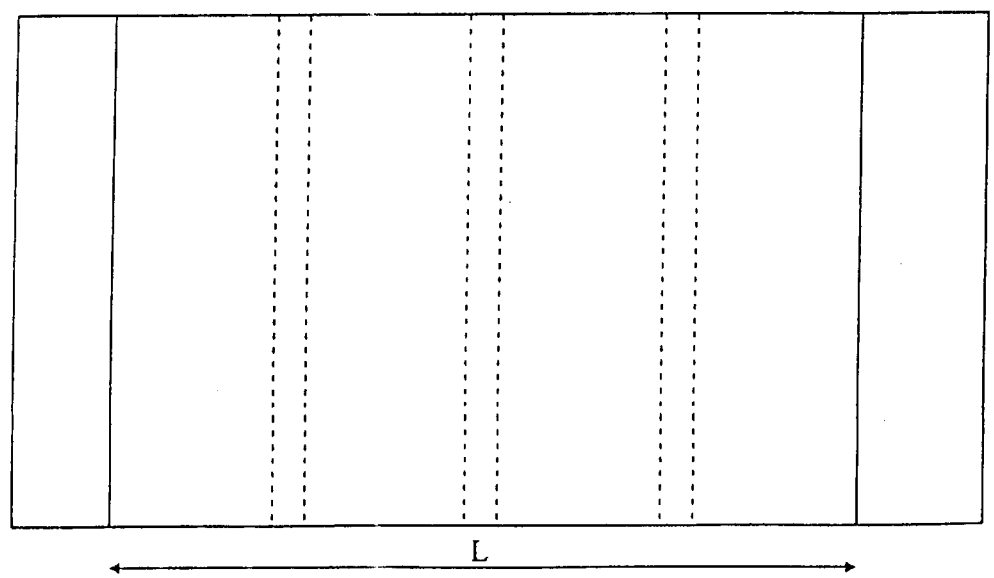
FIG. 12 shows a top view of the device of FIG. 11.

FIG. 12 shows in top view a portion of a conductive line L formed according to the present invention. Line L can take the shape adapted to a specific application. For example, line L can be given a spiral shape to form an inductance.

Although the present invention has been described hereabove as including a choice of metallization thicknesses t1 and t2 to fill a window of width W, in practice, in a given technology, thicknesses t1 and t2 are fixed and width W is chosen according to the thicknesses. Thus, thickness t3 is substantially equal to half the width of the conventional vias 4-1 or 4-2 that filling layer 23 is assumed to fill in portions of the general structure not shown in the drawings; t1 is the conventional thickness of metallization layers, defined by the usual parameters of a standard fabrication method; and thickness t2 is chosen to be as large as possible, and is only limited by the standard limits of metallization layer etching. Then, width W is chosen to be slightly lower than 2(t1+t2+t3).

An advantage of the present invention is that each of the conductive layers forming the thick conductive line according to the present invention is a thin layer. The disadvantages associated with the use of thick layers are thus avoided.

Another advantage of the present invention is that the upper surface of the last interconnection layer is planarized, without requiring a specific processing.

Another advantage of the present invention is that the implementation of the thick conductive line is performed simultaneously with the normal metallization steps of a given technology of integrated circuit manufacturing.

Of course, the present invention is likely to have various alterations, modifications, and improvements which will readily occur to those skilled in the art, as concerns its implementation and its applications. In particular, each of the filling or interconnection metal layers may be made of other materials than those involved in the above description of specific embodiments of the present invention, chosen according to the desired application. Further, as has been seen previously, the thicknesses of each of these layers will be adapted to conform to the constraints of standard integrated circuit manufacturing methods.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of formation of a conductive line on integrated circuits including the steps of:
   etching a first insulator layer to create therein several parallel grooves of predetermined width along the pattern of the conductive line to be formed,
   depositing and etching a first interconnection layer of a first thickness, and
   depositing and etching a second interconnection layer of a second thickness;
   wherein the predetermined width is greater than twice the greatest of the two thicknesses and smaller than twice the sum of the thicknesses.

2. The method of claim 1, wherein the step of deposition and etching of the first interconnection layer is preceded by a step of formation of conductive spacers of a third thickness on the lateral walls of the grooves, the predetermined width then being increased by twice the thickness of the spacers.

3. The method of claim 2, wherein the spacers are made of tungsten.

4. The method of claim 1, wherein the step of deposition and etching of the second interconnection layer is immediately preceded by the steps of:
   depositing a second insulator layer;
   etching the second insulator layer to expose the first interconnection layer above the grooves; and
   depositing a second etch stop layer.

5. The method of claim 1, wherein the first and second interconnection layers are layers of a conductor chosen from the group complrising aluminum, copper, and their alloys, possibly with silicon.

6. A method of formation of a conductive line on integrated circuits, comprising the steps of:
   forming in a first insulator layer several grooves each of predetermined width and disposed along said conductive line;
   depositing over the first insulator layer a first interconnection layer of a first thickness and extending into the grooves formed in the first insulator layer;
   depositing over the first interconnection layer a second interconnection layer of a second thickness;
   said step of forming grooves including forming each groove of a predetermined width that is greater than twice the greatest of the said first and second thicknesses; and
   said step of forming grooves including forming each groove of a predetermined width that is less than twice the sum of said first and second thicknesses.

7. The method of claim 6 wherein said step of depositing the first interconnection layer includes forming a hollow in said first interconnection layer that overlies said groove of predetermined width.

8. The method of claim 7 wherein said hollow is of a width W1 less than said groove predetermined width.

9. The method of claim 8 wherein said width W1 is less than said width W by substantially twice the said first thickness.

10. The method of claim 9 wherein the step of depositing the first interconnection layer is preceded by a step of formation of conductive spacers of a third thickness or the lateral walls of the groove.

11. The method of claim 10 wherein the said step of formation of conductive spacers comprises the sub-steps of:
    depositing a filling layer directly on the first insulator layer to extend into and fill said groove; and
    etching said filling layer to leave spacers formed on the lateral walls of the groove.

12. The method of claim 11 wherein said sub-step of etching comprises plasma etching.

13. The method of claim 11 wherein said groove width is reduced by twice the said third thickness of each spacer.

14. The method of claim 13 wherein said formed grooves each of predetermined width W separated by an insulator layer portion S defined between adjacent grooves.

15. The method of claim 14 wherein said interval S is small in comparison to said width W.

16. The method of claim 11 wherein the thickness of the insulating layer is on the order of 0.6 to 0.8 $\mu$m, width W is on the order of 2 to 4 $\mu$m and the interval S is on the order of 0.4 $\mu$m.

17. The method of claim 16 wherein said first interconnection layer is made of aluminum or aluminum-copper, of a thickness t1 between 0.6 and 1 $\mu$m, and said second interconnection layer is made of aluminum, or aluminum-copper, sputtered at high temperature at a thickness on the order of 0.8 to 1.2 $\mu$m.

18. The method of claim 7 wherein the step of depositing the first interconnection layer is preceded by a step of formation of conductive spacers of a third thickness or the lateral walls of the groove.

19. The method of claim 18 wherein said step of formation of conductive spacers comprises the sub-steps of:
    depositing a filling layer directly on the first insulator layer to extend into and fill said groove; and
    etching said filling layer to leave spacers formed on the lateral walls of the groove.

20. The method of claim 7 wherein said step of depositing said second interconnection layer causes a complete filling of said hollow.

21. The method of claim 20 wherein the deposition of the second interconnection layer is by chemical vapor deposition.

22. The method of claim 20 wherein the deposition of the second interconnection layer is by a hot metal sputtering technique.

23. The method of claim 20 wherein second interconnection layer is comprised of aluminum and copper.

24. The method of claim 6 wherein said step of depositing a first interconnection layer comprises the steps of depositing and etching.

25. The method of claim 6 wherein said step of depositing the second interconnection layer comprises the steps of depositing and etching.

* * * * *